United States Patent [19]

Shimano et al.

[11] 4,247,373

[45] Jan. 27, 1981

[54] METHOD OF MAKING SEMICONDUCTOR DEVICE

[75] Inventors: Akio Shimano, Takatsuki; Hiromitsu Takagi, Muko, both of Japan

[73] Assignee: Matsushita Electric Industrial Co., Ltd., Kadoma, Japan

[21] Appl. No.: 47,931

[22] Filed: Jun. 12, 1979

[30] Foreign Application Priority Data

| Jun. 20, 1978 | [JP] | Japan | 53-75104 |
| Jan. 12, 1979 | [JP] | Japan | 54-3130 |
| Jan. 12, 1979 | [JP] | Japan | 54-3131 |
| Mar. 20, 1979 | [JP] | Japan | 54-32747 |

[51] Int. Cl.³ .................. C25D 11/02; C25D 11/32
[52] U.S. Cl. ............................... 204/15; 29/571; 29/578; 204/56 R
[58] Field of Search ............... 204/15, 56 R; 29/571, 29/578

[56] References Cited

U.S. PATENT DOCUMENTS

| 3,345,274 | 10/1967 | Schmidt | 204/56 R |
| 3,345,275 | 10/1967 | Schmidt | 204/15 |
| 3,377,258 | 4/1968 | Schmidt | 204/15 |
| 3,404,073 | 10/1968 | Scott, Jr. | 204/15 |
| 3,457,148 | 7/1969 | Waggener | 204/56 R |
| 4,080,721 | 3/1978 | Hung | 204/15 |
| 4,108,738 | 8/1978 | Cho | 204/15 |
| 4,157,610 | 6/1979 | Kamei | 204/56 R |

Primary Examiner—T. M. Tufariello
Attorney, Agent, or Firm—Cushman, Darby & Cushman

[57] ABSTRACT

An epitaxial layer having a specified conductivity type formed on a semiinsulative or high resistivity semiconductor substrate or insulative substrate is anodized (anodically oxidized) by a predetermined D.C. current under an illumination of light of a predetermined intensity, thereby a depletion layer is formed beneath an oxide layer, which is formed by the anodizing, and the anodizing ceases in areas where the bottom face of the depletion layer reaches the semiinsulative or high resistivity semiconductor substrate or insulative substrate thus retaining a layer of highly uniform thickness layer of the epitaxial grown layer on the substrate.

40 Claims, 23 Drawing Figures

METHOD OF MAKING SEMICONDUCTOR DEVICE

BACKGROUND OF THE INVENTION

1. Field of the Invention

The present invention relates to an improved method of making semiconductor device comprising a layer of highly accurate thickness with a sufficient reproducibility and an easily controllable process.

2. Description of the Prior Art

Hitherto, in making a compound semiconductor device employing a GaAS or the like, it has been known that a thickness control is a very important problem for an epitaxially grown layer formed on a semiinsulative or of high resistivity semiconductor layer or insulative substrate. For example, in Schottky gate field-effect transistors (hereinafter called MESFETs) employing GaAs, which recently become widely to be used, it is necessary that distribution of thickness of the semiconductor substrate must be suppressed within $\pm 0.02$ $\mu$m for the thickness of 0.25 $\mu$m. Such accurate control of the thickness has been almost impossible even though by utilizing known epitaxial growth technique as well as chemical etching technique. In order to ease such difficulty, a new technique called anodic oxidation (or anodization) in an electrolyte is recently being developed. This is the process wherein etching of the active region is made by forming anodized film of a relatively highly accurate thickness in the active region by controlling current or voltage, followed by removing the oxide film thereby to suppress distribution of thickness of the resultant active region. However, the anodic oxidation method also has a problem that the active region as initially formed in the first step must have uniformly accurate thickness on the whole area of the substrate and such requirement is substantially impossible to perform.

Thus, hitherto, forming of a highly accurate thickness active region has been a very difficult problem.

SUMMARY OF THE INVENTION

Object of the present invention is to provide a novel and an improved method of manufacturing a semiconductor device having a layer of a highly accurate thickness regardless of its initial thickness.

DESCRIPTION OF THE PREFERRED EMBODIMENT(S)

Figure 1A:
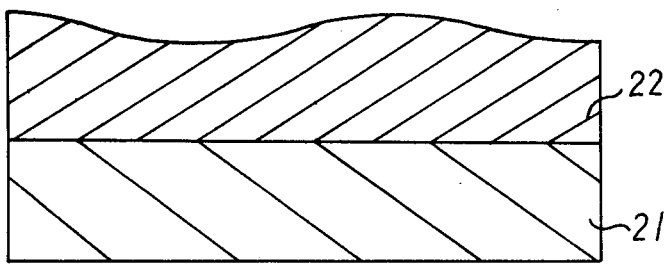
In FIG. 1, (a) to (e) are sectional side views showing steps of the method of making a semiconductor device embodying the present invention.

Method of making semiconductor device of the present invention comprises an anodic oxidation process of an n-conductivity type semiconductor layer formed on an insulative, semiinsulative or high resistivity semiconductor substrate, and is characterized in that the anodic oxidation process includes the steps of holding an electrolytic current of the anodic oxidation to a predetermined constant value illuminating the anodically oxidized face of the semiconductor layer with a light of such a predetermined intensity that forms a depletion layer of a specified thickness and continuing said anodic oxidation until bottom face of said depletion layer reaches an interface between said n-conductivity type semiconductor layer and said insulative, semiinsulative or high resistivity semiconductor substrate.

Principle of the present invention is elucidated with respect to an embodiment.

When an n-conductivity type semiconductor layer formed on an insulative, semiinsulative or of very high resistivity semiconductor substrate is anodically oxidized, the semiconductor layer gradually changes into anodically oxidized layer from the surface, thereby the remaining semiconductor layer gradually becomes thin. In such anodic oxidation, a depletion layer is formed by impression of a voltage at the interface between the anodically oxidized film and the underlying remaining semiconductor layer. When the bottom face of the depletion layer reaches the face of the insulative, semiinsulative or of high resistivity substrate, the anodic oxidizing current stops to flow there, since the remaining semiconductor layer is eliminated at that part. Accordingly, the anodic oxidation automatically stops at the part where the bottom of the depletion layer reaches the substrate. Therefore, the remaining n-conductivity type semiconductor layer, which is retained unoxidized under the anodically oxidized film, has the thickness of the depletion layer. The present invention features that the thickness of the depletion layer is accurately controlled by intensity of light illuminating on the wafer during the anodic oxidation.

The anodic oxidation in the electrolyte under illumination of light is elucidated in detail. In the wafer, pairs of electrons and positive holes, which have been stimulated by the light illumination, are avalanche-multiplied by means of a high electric field, which is produced by a potential in the depletion layer. The amount of the resultant avalanche-multiplied current is represented as a product of a photo-stimulated current Iph and an avalanche-multiplication factor M, the photo-stimulated current Iph being the current obtainable when the n-conductivity type semiconductor layer and a platinum electrode is shortcircuited outside. Since the abovementioned resultant avalanche-multiplied current is equal to that of anodic oxidizing current Ia, the following equation holds:

$$\text{Iph} \cdot M = \text{Ia} \tag{1}$$

Since the photo-stimulation current Iph is proportional to the light illumination intensity $\phi$, for a light intensity $\phi_O$ which makes the Iph equal to the anodic oxidizing current Ia, from the equation (1) the following equation holds:

$$M = \frac{Ia}{Iph} = \frac{\phi_0}{\phi} \tag{2}$$

On the other hand, according to empirical finding, the multiplication factor M can be represented as follows:

$$M = \frac{1}{1 - \left(\frac{V}{V_B}\right)^n} \tag{3}$$

where, V is a voltage impressed thickwise across the depletion layer formed between the substrate and anodic oxidized film and $V_B$ is the breakdown voltage of the depletion layer.

Then, from the equations (2) and (3), the following equation holds:

$$V/V_B = (1 - \phi/\phi)^{1/n} \tag{4}$$

The following equations (5), (6) and (7) hold from known physical relations among:

$\epsilon_s$ . . . dielectric constant of the n-conductivity type semiconductor layer,
$N_D$ . . . impurity concentration of the semiconductor layer,
q . . . charge of the electron,
Emax . . . breakdown electric field of the semiconductor layer,
W . . . thickness of the depletion layer when impressed voltage across the semiconductor layer is V,
$W_B$ . . . thickness of the depletion layer when impressed voltage across the semiconductor layer is $V_B$,
n . . . a constant specific to the substances of the semiconductor layer and the anodically oxidized film.

$$W = \left(\frac{2\epsilon_s}{qN_D} \cdot V\right)^{\frac{1}{2}} \tag{5}$$

$$V_B = \frac{1}{2} \cdot \text{Emax} \cdot W_B \tag{6}$$

$$W_B = \frac{\epsilon_s}{qN_D} \cdot \text{Emax} \tag{7}$$

From the equations (4), (5), (6) and (7), the following equation holds:

$$W \cdot N_D = \frac{\epsilon_s \cdot \text{Emax}}{q} \left(1 - \frac{\phi}{\phi_0}\right)^{\frac{1}{2n}} \tag{8}$$

From the equation (8), it is understood that $W \cdot N_D$ product can be controlled by controlling the amount $\phi$ of the illuminating light, since Emax is a constant and $\phi_O$ is proportional to the anodic oxidation current.

In FIG. 1, (a) to (c) illustrate manufacturing steps of the semiconductor devices in accordance with the present invention.

Firstly, as shown in FIG. 1(a), on a semiinsulative GaAs substrate 21, an n-conductivity type semiconductor layer 22 having a predetermined uniform impurity concentration $N_D$ is formed by means of known vapor phase epitaxial growth method. The epitaxial layer 22 is generally not necessarily of accurately uniform thickness, but has uneven surface as shown in FIG. 1(a).

Figure 1B:
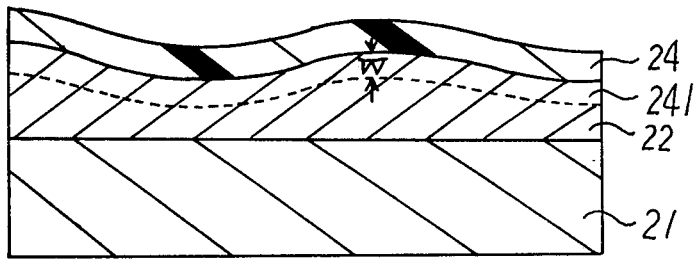
Figure 1C:
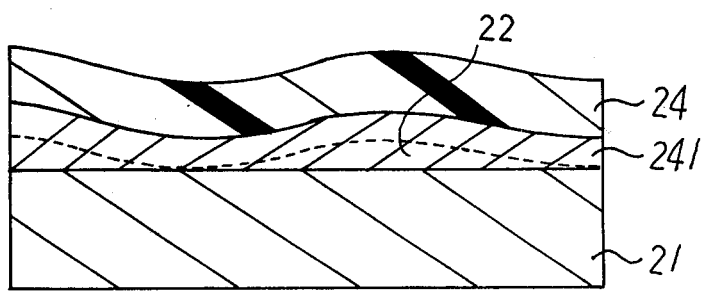

Then, under light illumination over the surface of the epitaxial layer 22, an anodic oxidation is carried out, by appropriately controlling the depletion layer thickness W through controlling of the light intensity, thereby an anodic oxide film 24 is formed. At the initial stage of the anodic oxidation, the anodic oxide film 24 is formed to have uniform thickness from the original surface of the epitaxial layer 22, and under the anodic oxide film 24 is formed the depletion layer 241 with a very uniform thickness W as shown in FIG. 1(b), Then, as the anodic oxidation proceeds, the bottom face of the depletion layer 241 reaches the substrate 21. Where the depletion layer 241 reaches the substrate 21, due to elimination of the remaining epitaxial layer 22 at that part, the anodic current, which has been flowing in a path of an ohmic contact electrode provided at an edge part of the epitaxial layer 22—the depletion layer 241—anodic oxide film 24—electrolyte and to a counter electrode in the electrolyte, diminishes to substantially zero. Therefore, the anodic oxidation at the part where the bottom of the depletion layer 241 reaches the substrate becomes to stop, while at other part where the bottom of the depletion layer 241 does not yet reach the substrate 21, the anodic oxidation proceeds, until at last the anodic oxidation automatically stops when bottom of all parts of the depletion layer 241 reaches the substrate 21 and anodic oxidation current stops flowing.

Figure 1D:
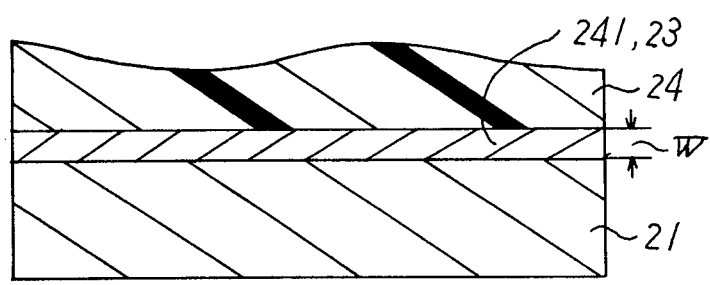
Figure 1E:
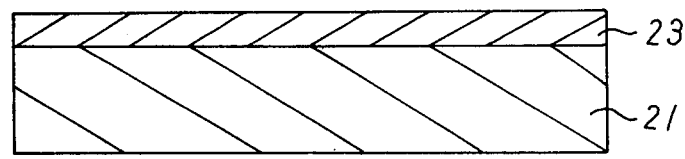

The thickness of the depletion layer 241 is uniquely determined by means of the intensity of light illuminating over the anodic oxide film 24. Therefore, at the final stage of the anodic oxidation when bottom of the all parts of the depletion layer 241 reaches the substrate 21, the retained epitaxial layer 22 has the same uniform thickness as that of the depletion layer 241 irrespective of the initial surface shape of the epitaxial layer 22 and thicknesses of parts of the anodic oxide film 24. In other words, the epitaxial layer 22 is anodically oxidized from the surface part retaining only the undermost part of the thickness equal to that of the depletion layer 241, which is uniquely controlled by the light intensity. Therefore, the unoxidized epitaxial layer 23 underneath the anodic oxide film 24 has a sufficiently controlled and accurately uniform thickness on all the area of the wafer face as shown in FIG. 1(d). The accuracy and the uniformity of the thickness of the retained epitaxial layer 23 can be easily controlled by controlling the light intensity, carrier concentration and so on.

Finally, by removing the anodic oxide film 24 by a known etchant liquid, a semiconductor wafer comprising an epitaxial layer formed with an accurately uniform thickness on an insulative, semiinsulative or of a high resistivity semiconductor substrate is completed.

As can be understood from the equation (8), the product of the impurity concentration $N_D$ and the thickness W of the resultant epitaxial layer 23 becomes constant, and accordingly, saturation drain current (a drain current for gate voltage $V_G=0$) of a MESFET manufactured by utilizing the epitaxial layer 23 as an active layer becomes constant.

EXAMPLE 1

Figure 2:
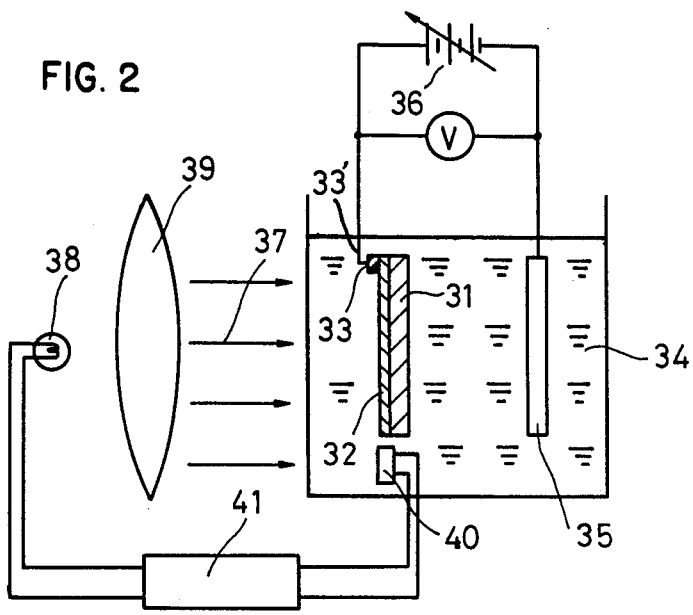
FIG. 2 is a schematic view showing an apparatus for embodying the method of the present invention.

An actual example of manufacturing a semiconductor wafer, which comprises an epitaxial layer having a highly uniform value of product of impurity concentration $N_D$ and thickness formed on a insulative, semiinsulative or of high resistivity, is described as follows:

At first, as shown in FIG. 2, on a semiinsulative GaAs substrate 31 having a specific resistivity of over 10Cm-Cm, an n-conductivity type GaAs epitaxial layer 32 having impurity concentration of $5 \times 10^{16}$ Cm$^{-3}$ to $1 \times 10^{17}$ cm$^{-3}$ and thickness of about 0.6 to 0.7 $\mu$m is formed by known vapor phase epitaxial growth method. Then, on an edge of the n-conductivity type GaAs layer 32, a known ohmic contact electrode 33 of Au-Ge alloy is formed. Then, the wafer is put in a quartz bath filled with a known anodic oxidizing electrolyte 34 consisting of 3 gr tartaric acid, 100 ml water, 200 ml propyleneglycol and a small amount of aqueous ammonia for H-ion adjustment. The electrolyte 34 is prepared to have the pH of 6.0. The temperature of the electrolyte 34 is 15° C. The temperature should be chosen in the range of 0°–60° C., because of dissolution of grown oxide films. The ohmic contact electrode 33 is connected to a positive terminal of a constant-current D.C. power source 36, and the electrode 33 the lead wire thereto 33 are insulated by a wax or photoresist from the electrolyte 34. A platinum cathode 35 is put in the electrolyte 34 and connected to a negative terminal of the power source 36. The constant-current D.C. power source 36 is controlled in a manner that an anodic oxidizing current of a current density of about 1 mA/cm$^2$ flows through the system.

Then, the front face, i.e., the face of the epitaxial layer 32 of the wafer is exposed to a light illumination from an intensity-controlled 280-watt tungsten lamp 38 and converged into uniform parallel rays 37 by a lens 39. The light intensity controlling is made by utilizing an output of a photo-detector 40 disposed at a close vicinity of the wafer and controlling a known light intensity controlling circuit 41. The light intensity should be carefully controlled in such a manner that the current density of photo-simulated current does not exceed that of anodic oxidation current.

When the anodic oxidation sufficiently proceeds and the bottom face of the depletion layer reaches the semiinsulative GaAs substrate 31 on all parts of the substrate face, then the anodic oxidation current stops, thereby abruptly increasing voltage across terminals of the D.C. power source 36, and at the same time, the anodic oxidation automatically stops. At this moment, the remaining unoxidized part of epitaxial GaAs layer 32 becomes to have the thickness equal to that of the depletion layer. Then, by removing the anodically oxidized film with utilizing 5% HCl as an etchant, a semiconductor wafer comprising an n-conductivity type GaAs layer having a uniform thickness formed on a semiinsulative GaAs substrate is completed. The resultant n-conductivity type GaAs layer has an accurate value of the product of impurity concentration and thickness.

Figure 3:
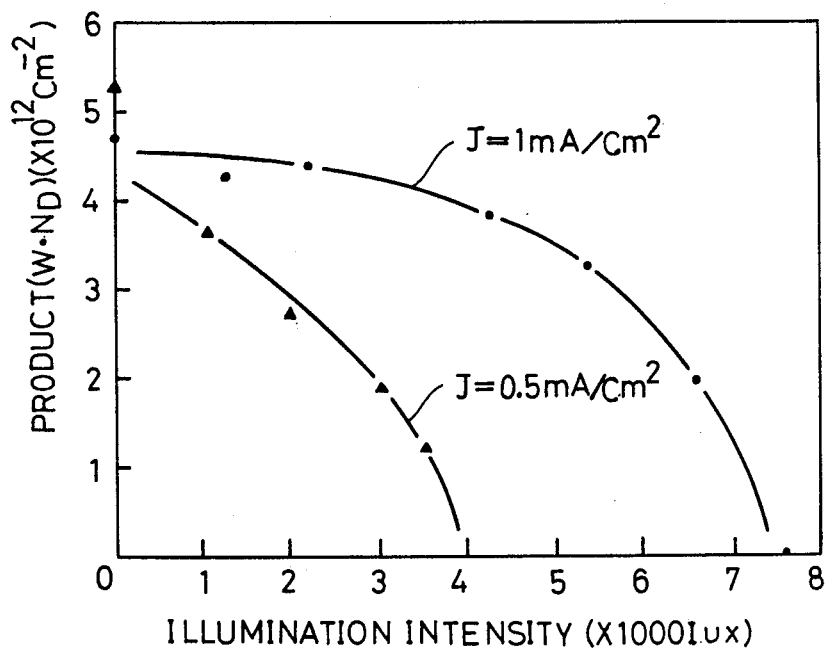
FIG. 3 is a graph showing relations between illumination intensity and Hall Product in the embodiment of FIG. 2.

FIG. 3 shows relations between illumination intensity and Hall Product (W.$N_D$) for the cases of anodic oxidation current densities J=1 mA/Cm$^2$ and J=0.5 mA/cm$^2$.

By means of the method in accordance with the present invention, an n-conductivity type layer having an accurately uniform thickness can be formed on an insulative, semiinsulative or of high resistivity semiconductor substrate.

Figure 4:
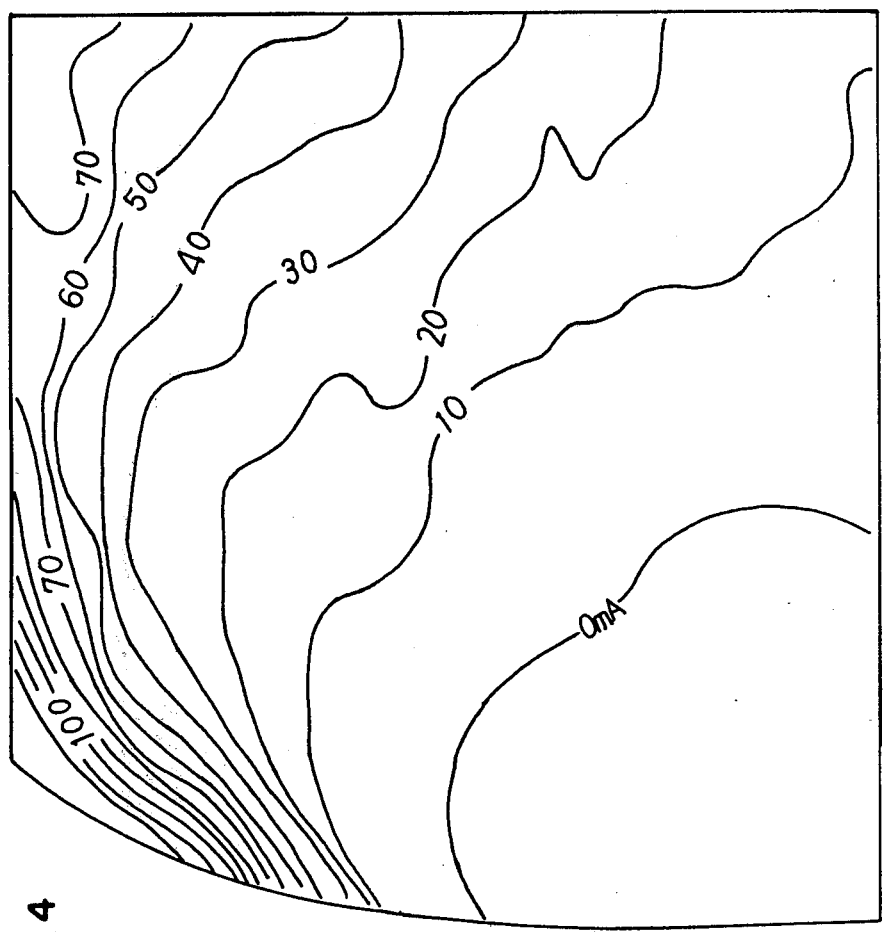
FIG. 4 is a surface distribution chart of saturation drain current $I_{DSS}$ of a Schottky gate field effect transistor (hereinafter called as MESFET) manufactured by employing a GaAs wafer made in accordance with the conventional anodic oxidation method.
Figure 5:
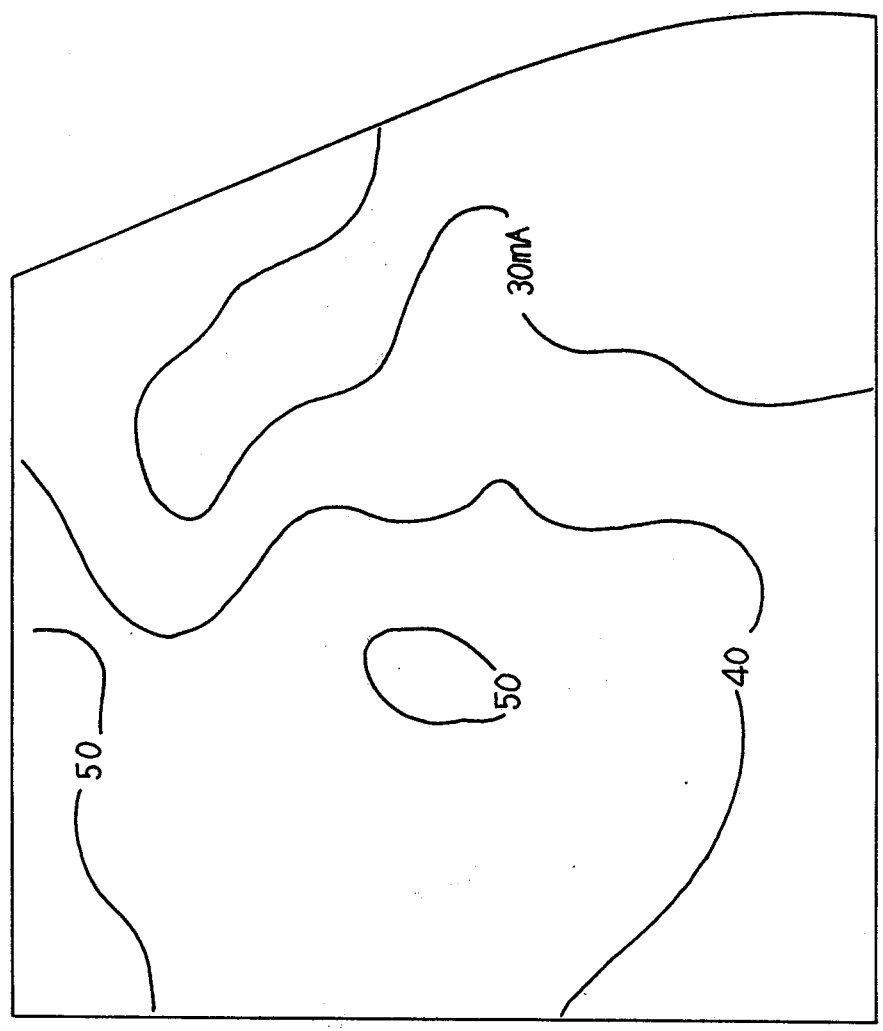
FIG. 5 is a surface distribution chart of saturation drain current $I_{DSS}$ of a MESFET manufactured by employing a GaAs wafer made in accordance with oxidation method of the present invention.

A single wafer of GaAs substrate with an n-conductivity type epitaxial layer thereon is cut into two pieces of similar sizes (about 18 mm × 18 mm each). A first piece is anodically oxidized in accordance with the conventional way (without utilizing the depletion layer), and a second piece is anodically oxidized in accordance with the present invention, and a number of MESFET's are formed on each wafer of the first piece and the second piece. FIG. 4 shows saturation drain currents $I_{DSS}$ of the first group MESFET's made on the first piece processed in the conventional anode oxidation. FIG. 5 shows saturation drain currents $I_{DSS}$ of the second group MESFET's made on the second piece processed in the present invention method. To describe more to details, in the conventional processing of the first piece of FIG. 4, the anode oxidation is made by illuminating the face of the wafer with the light intensity of about 300,000 lx and current density of j=1 mA/cm$^2$, so that no depletion layer is formed in the n-conductivity type layer, and obtained a uniform 0.5 $\mu$m thick oxide film. On the other hand, in the processing of the second piece of FIG. 5, the anode oxidation is made by illuminating the face of the wafer with the light intensity of about 3,000 lx and current density of j=1 mA/cm$^2$, so that a depletion layer of a suitable thickness is formed underneath the anodically oxidized film. For both MESFET's, the measurements are made under the same condition that the source-gate voltage $V_{GS}=0V$, and the source-drain voltage $V_{DS}=5$ V.

As can be clearly understood from the comparison between FIG. 4 and FIG. 5, the devices in accordance with the conventional way (FIG. 4) shows such a wide distribution of $I_{DSS}$ of from 0 mA to 100 mA; while the devices in accordance with the present invention way (FIG. 5) shows such a narrow distribution of from 30 mA to 50 mA.

EXAMPLE 2

Figure 6:
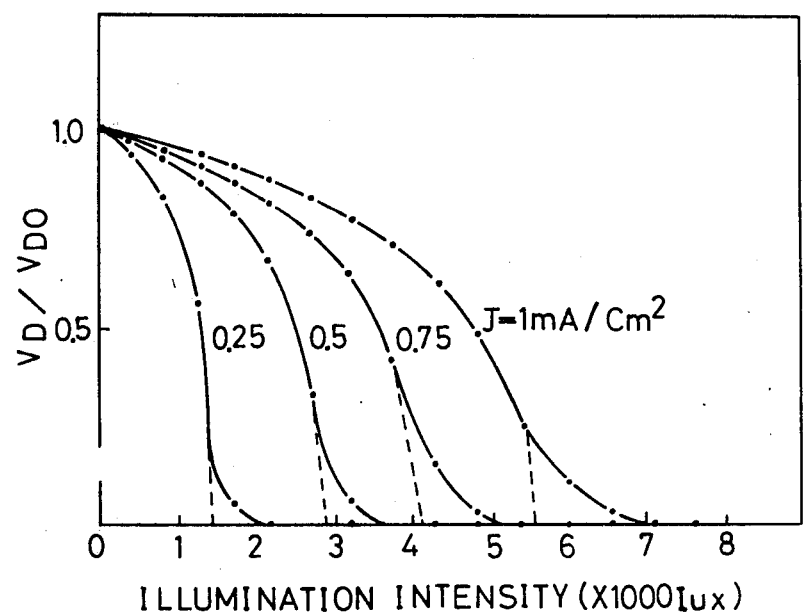
FIG. 6 is a graph showing relations between illumination intensity and depletion layer voltage.

Pinch-off voltage of a MESFET formed by utilizing the wafer made in accordance with the present invention can be controlled to a predetermined value without knowing initial values of thickness and impurity concentration of the n-conductivity type layer on an insulative, semiinsulative or of high resistivity semiconductor substrate. Details are described as follows:

In the wafer made in accordance with the present invention, the thickness of the unoxidized remaining n-conductivity type GaAs layer is equal to that of the depletion layer. Accordingly, when a MESFET is made by utilizing the wafer made in accordance with the present invention, the pinch-off voltage $V_P$ of the MESFET and the voltage $V_D$ across both faces (thicknesswise) of the depletion layer in the anodic oxidation process has the following relation:

$$V_P = V_d - V_O \tag{9}$$

where $V_O$ is a built-in voltage at the Schottky barrier of the MESFET. Accordingly, we can understand that the pinch-off voltage $V_p$ can be controlled through a controlling of the voltage $V_D$. The voltage $V_D$ has a dependency on the anodic oxidation current density and illumination intensity $\phi$. FIG. 6 shows relations between the illumination intensity $\phi$ and the voltage $V_D$ across the depletion layer, for the oxidation current densities as a parameter. The curves of FIG. 6 show that, in each curve, for the illumination intensity of over specified value $\phi_{Oj}$ (for example, 7000 lx for the curve of j=1 mA/cm²), the voltage $V_D$ becomes 0. Empirical facts shows that the voltage $V_D$ is also dependent on the carrier concentration of the layer.

A voltage $V_C$ between the n-conductivity type epitaxial GaAs layer and the platinum cathode in the electrolyte and the voltage $V_D$ has the following relation:

$$V_C = V_D + a \cdot t \tag{10}$$

where t is the anode oxidizing time and
a is a constant determined by the anode oxidizing current density.

Figure 7:
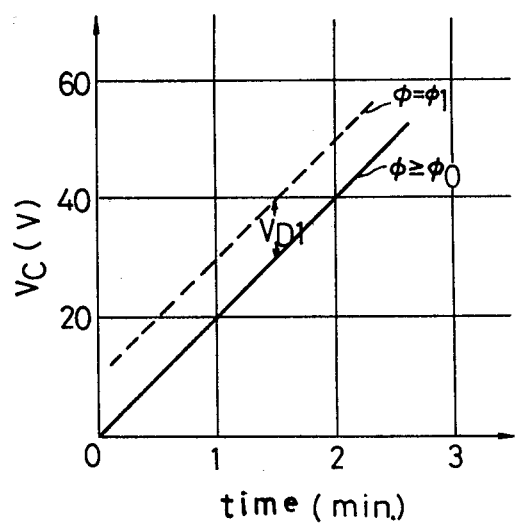
FIG. 7 is a graph showing relations between oxidation time and anodic oxidation voltage.

As shown in FIG. 7, from the equation (10), a voltage $V_{D1}$ across both faces of the depletion layer can be obtained as a difference between the anodic oxidation voltage Vc1 for an illumination intensity $\phi_1$ and an oxidation voltage Vc0 for the illumination intensity of over $\phi_O$ in the anodic oxidation. Namely, the voltage $V_{D1}$ is given by the equation $V_{D1} = Vc1 - Vc0$. Accordingly, a MESFET of a desired pinch-off voltage Vp1 can be made by first anodically oxidizing the n-conductivity type layer under illumination by such an intensity $\phi_1$ as to make the voltage $V_D$ across both faces of the depletion layer to the value of $V_{D1}$, and then, after automatic stopping of the anodic oxidation by removing the anodically oxidized film. By means of the above-mentioned process, irrespective of initial thickness and carrier concentration of the n-conductivity type layer, a MESFET having a desired pinch-off voltage can be made.

Figure 8:
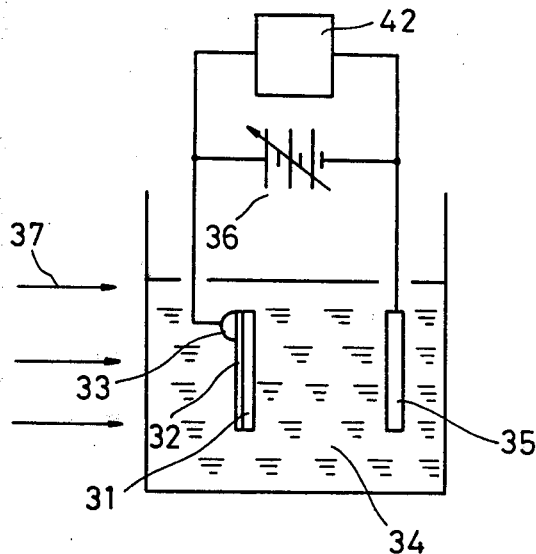
FIG. 8 is an example of apparatus for embodying the manufacturing method of the present invention.

Actual anodic oxidation of the semiconductor wafer is carried out by an apparatus shown in FIG. 8, which is analogous to that shown in FIG. 1 of the previous example.

Figure 9:
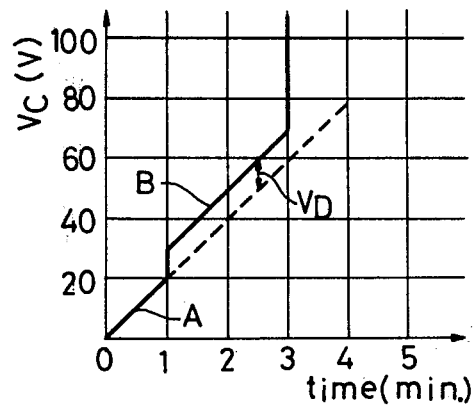
FIG. 9 is a chart obtained by a chart-recorder 42 of FIG. 8.

First, under illumination 37 with the illumination intensity of 100,000 lx over an n-conductivity GaAs epitaxial layer 32 formed on a semiinsulative or of a high resistivity GaAs substrate 31, an anodic oxidation is made. During the anodic oxidation, the voltage of anodic oxidation Vc first increases along the oblique line A in FIG. 9. Then, at 1 minute time after the beginning of the anodic oxidation, the illumination intensity is decreased to a lower value, and accordingly, the voltage Vc suddenly increases by the value of $V_D$, which is the value corresponding to a desired pinch-off voltage. Namely, the illumination intensity is lowered and thereafter set in a manner that the operating point moves along the raised oblique line B, of FIG. 9 and the anodic oxidation is carried out under the low-set illumination. Then, as the anodic oxidation proceeds and when the bottom of all parts of the depletion layer reaches the substrate 31, the voltage observed by the chart recorder 42 again suddenly increases, as shown at the time of 3 minutes after the beginning in FIG. 9, and then the anodic oxidation is automatically stopped. Then, by removing the anodically oxidized film by a known method, it is possible to obtain a semiconductor wafer, which has an accurate thickness n-conductivity GaAs epitaxial layer on the semiinsulative or of a high resistivity GaAs substrate and is suitable for use in manufacturing MESFETs having desirable pinch-off voltage.

Figure 10:
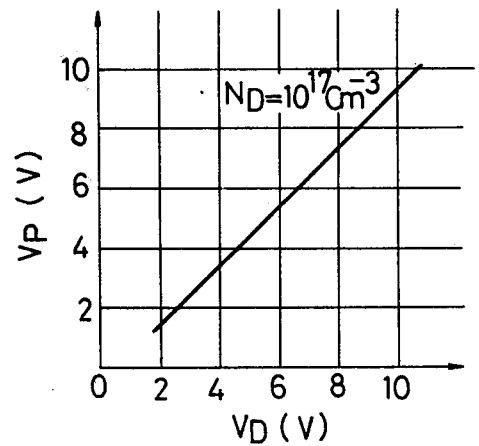
FIG. 10 is a graph showing a relation between set depletion layer voltage and pinch-off voltage of a MESFET formed by embodying the present invention.

FIG. 10 shows a relation between the across-depletion layer voltage $V_D$ and pinch-off voltage of the MESFET wherein Cr-Pt-Au electrode is used for the gate electrode. By utilizing the characteristic curve shown in FIG. 10 in the anodic oxidation controlling (i.e., shifting the curve for the voltage $V_D$) elucidated with reference to FIG. 9, MESFETs having uniform pinch-off voltage of a desired value is obtainable. Namely, firstly by illuminating with a very strong intensity the depletion layer, the depletion layer is not formed. This is also represented by the curves of FIG. 6 which shows that $V_D$ is zero for a sufficiently large illumination intensity. Therefore in this state, only a voltage across the anodically oxidized film is observed by the chart recorder 42. Secondly by reducing the illumination intensity, a voltage $V_D$ appears across the depletion layer, and hence the operating point is on the elevated oblique line B. Then, as the anodic oxidation proceeds, the depletion layer reaches the substrate at all parts of the substrate and the anodic oxidation current stops flowing and the voltage across the electrode 33 and the electrode 35 suddenly increases.

A single wafer of GaAs substrate with an n-conductivity type epitaxial layer thereon is cut into two pieces of similar sizes (about 18 mm×18 mm each). A first piece is anodically oxidized in accordance with the conventional way (without utilizing the depletion layer), and a second piece is anodically oxidized in accordance with the present invention, and a number of MESFETs are formed on each wafer of the first piece and the second piece. FIG. 1 shows pinch-off voltages Vp of the first group MESFETs made on the first piece processed in the conventional anode oxidation, and FIG. 12 shows pinch-off voltages Vp of the second group MESFETs made on the second piece processed in the present invention method. To describe more to details, in the conventional processing of the first piece of FIG. 11, the anode oxidation is made by illuminating the face of the wafer with the light intensity of about 300,000 lx and the current density of j=1 mA/cm², so that no depletion layer is formed in the n-conductivity type layer, and obtained a uniform 0.5 μm thick oxide film. On the other hand, in the processing of the second piece of FIG. 12, the anode oxidation is made by illuminating the face of the wafer with the light intensity of about 3,000 lx, which makes the voltage $V_D$ across the depletion layer of about 4.7 V, and current density of j=1 mA/cm², so that a depletion layer which makes the voltage $V_D$ thereacross of about 4.7 V. For both MESFETs, the measurements are made under the same condition that the drain-source current $I_{DS}=100$ μA, and the source-drain voltage $V_{DS}=5$ V.

Figure 11:
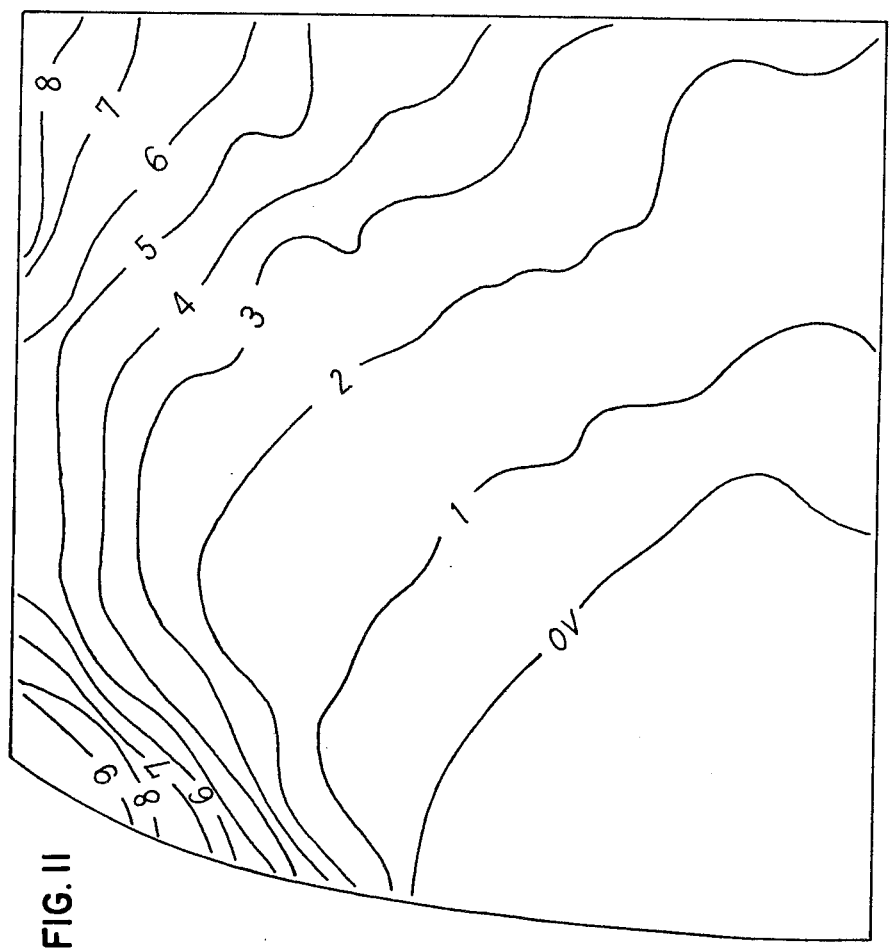
FIG. 11 is a surface distribution chart of pinch-off voltages $V_p$ of a MESFET manufactured by employing a GaAs wafer made in accordance with the conventional anodic oxidation method.
Figure 12:
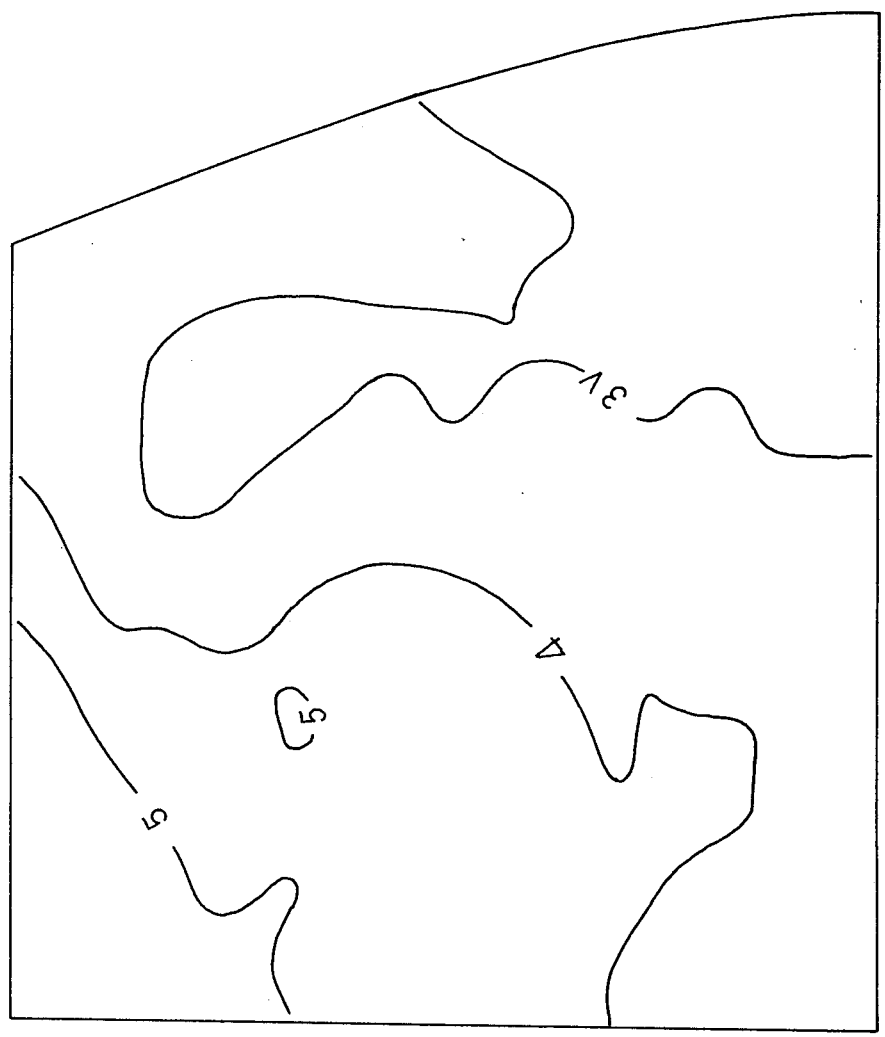
FIG. 12 is a surface distribution chart of pinch-off voltage $V_p$ of a MESFET manufactured by employing a GaAs wafer made in accordance with the oxidation method of the present invention.

As can be clearly understood from the comparison between FIG. 11 and FIG. 12, the device in accordance with the conventional way shows such a wide distribution of Vp of from 0 V to 8 V, while the device in accordance with the present invention way (FIG. 12) shows such a small distribution of from 3 V to 5 V.

EXAMPLE 3

The method of the present invention is also applicable to a manufacturing of so-called recess type field effect transistor (hereinafter called FET), wherein the gate region only is selectively anodic-oxidized, thereby to form an active region shaped in a manner that thickness of the source region and the drain region are larger than the part underneath the gate region.

Details of the manufacturing of the recess type FET are described below:

In FIG. 13, (a) to (d) show steps of making a recess structure MESFET.

Figure 13A:
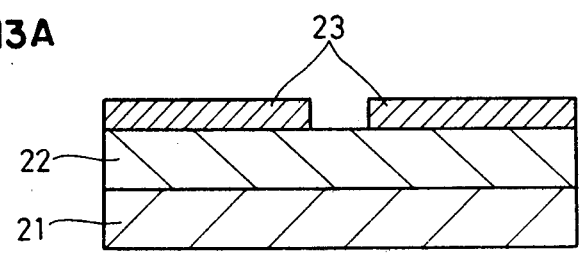
In FIG. 13, (a) to (d) are sectional side views showing steps of the method of making a semiconductor device embodying the present invention.
Figure 13B:
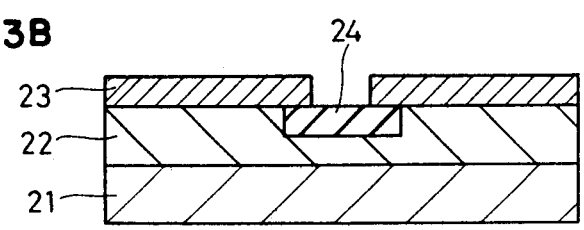

Firstly, as shown in FIG. 13(a), on a semiinsulative GaAs substrate 21, an n-conductivity type GaAs epitaxial layer 22 is formed. Then on the epitaxial layer 22, a photoresist film 23 is formed and an opening is formed on the photoresist film 23 at a part to become the gate region. Then on an edge of the n-conductivity type epitaxial layer 22, a known ohmic contact electrode of Au-Ge alloy is formed for anodic oxidation. Then the wafer is put in a quartz cup filled with a known anodic oxidizing electrolyte consisting of 3 gr tartaric acid, 100 ml water, 200 ml propyleneglycol and a small amount of aqueous ammonia for H-ion adjustment. The electrolyte is prepared to have the pH of 6.0. The ohmic contact electrode connected to the epitaxial layer 22 is connected to a positive terminal of a constant-current D.C. power source, and a platinum cathode in the electrolyte is connected to a negative terminal of the D.C. power source. The constant current D.C. power source is controlled in a manner that an anodic oxidizing current of a current density of about 1 Ma/cm$^2$ flows through the system. The epitaxial layer 22 is exposed to an illumination of about 3,000 lx so as to receive light through the opening of the photoresist film 23. Thus, an accurate thickness anodic oxidized film 24 is formed on the exposed part of the epitaxial layer 22 as shown in FIG. 13(b).

Figure 13C:
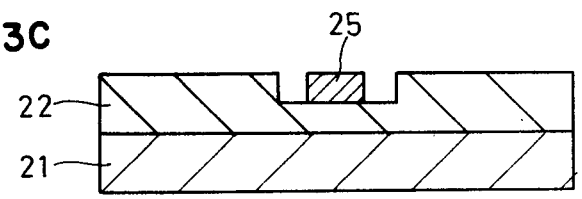
Figure 13D:
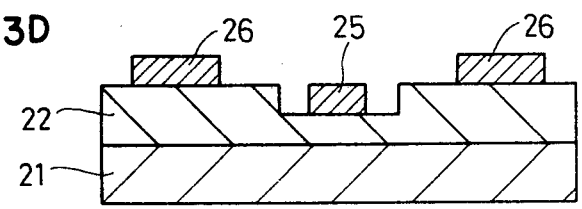

Then, the photoresist film 23 is removed by known art, and subsequently the anodic oxidized film 24 is also removed by washing with dilute hydrochloric acid to form a recess as shown in FIG. 13(c).

Then, as shown in FIG. 13(c), a gate electrode 25 of Cr-Pt-Au film is formed by known sequential vacuum evaporations. Finally by forming source and drain electrodes 26, 26 of known Au-Ge alloy on both sides of the recess part by known vacuum evaporation method, the recess structure MESFET is completed.

In accordance with the use of the present invention, the thickness of the remaining thin epitaxial layer under the recess is accurately controlled by means of the illumination intensity, instead of conventional controlling of the depth of the recess. Accordingly, an extraordinary thin retained layer can be formed in a very thick n-conductivity type GaAs layer, threby enabling drastically reducing source-gate resistance to a fraction of the value of the conventional device wherein forming such deep recess has been impossible. Accordingly, a high frequency characteristic of MESFET can be greatly improved.

Furthermore, since a deep recess can be formed in the n-conductivity type layer, the active layer under the gate electrode can be made very thin. Therefore, a pinch-off state of MESFET can be obtained by means of contact potential difference between the gate electrode and the active region, and hence, a high speed FET can be obtained.

EXAMPLE 4

The present invention is also applicable to form a resistor on recently developed semiconductor IC's utilizing an n-conductivity silicon on sapphire substrate or n-conductivity semiconductor on a semiinsulative GaAs substrate. By utilizing the method of the present invention, an accurate resistor can be formed in such IC's by oxidizing selected part of an n-conductivity semiconductor layer to a desired depth, thereby retaining a resistor region having an accurately controlled product of thickness and carrier concentration.

Figure 14A:
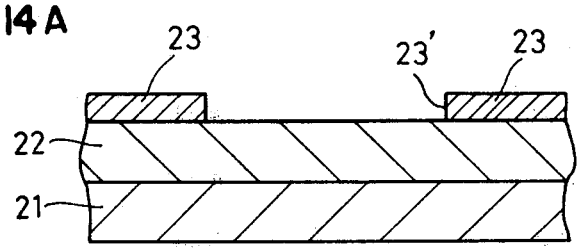
In FIG. 14, (a) to (c) are sectional side views showing steps of forming resistance member in an IC by embodying the present invention.
Figure 14B:
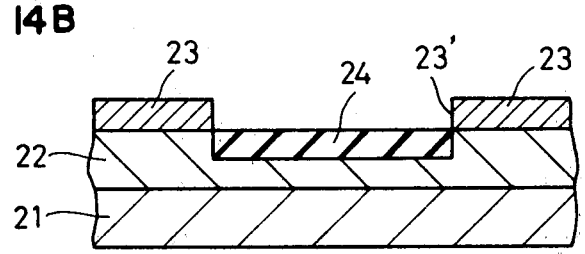
Figure 14C:
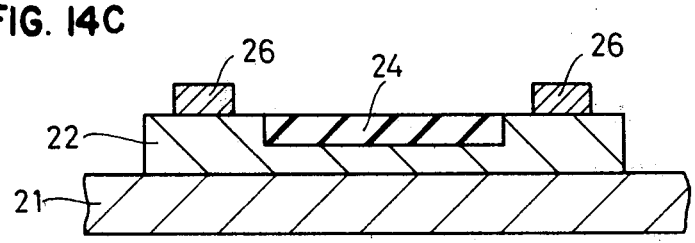

Detailed embodiment is elucidated as follows;

As shown in FIG. 14, on a semiinsulating GaAs substrate 21 having the specific resistivity of $10^4 \Omega$cm, an n-conductivity type GaAs layer 22 is epitaxially formed. Then a photoresist film 23 is formed by known art so as to have an opening 23' on a part to form a resistor. Then, the wafer is anodically oxidized under illumination of a tungsten lamp light, in a known anodic-oxidizing electrolyte, which consists of 3 gr tartaric acid, 100 ml water, 200 ml propyleneglycol and a small amount of aqueous ammonia for H-ion adjustment, thereby the electrolyte being adjusted to have the pH of 6.0. By suitably controlling the illumination intensity, for example, at about 3000 lx, the anodic oxidation is made thereby to form an anodically oxidized film 24 in the n-conductivity type substrate 22 as shown in FIG. 14(b). Then, after removing the photoresist film 23 by known method, the resistor region is isolated from other parts of the IC by a known selective etching method. Then by providing ohmic contacting electrodes 26,26 of known Au-Ge alloy on both sides of the resistor region, the resistor on the IC is completed.

In the abovementioned method of forming the resistor on an IC, a product of impurity concentration $N_D$ and thickness t of the n-conductivity GaAs layer 22 is uniquely and accurately controlled by the illumination intensity control. Therefore, the sheet resistance of the resistor part is automatically adjusted with satisfactory reproducibility without necessity of knowing initial thickness or impurity concentration of the resistor part, but only by controlling the illumination intensity. When, by increasing the illumination intensity, a very thin layer of the n-conductivity type GaAs can be formed thereby enabling to easily provide a very high and accurate sheet resistance in a small area. Accordingly, design and production of the IC becomes easy and hence, high integration of IC can be made possible. Furthermore, since the anodically oxidized film 24 on the covering the resistor parts is an inert insulating film, the oxide film is useful in protecting the underlying resistor part.

What is claimed is:

1. A method of making a semiconductor device comprising the anodic oxidation of an n-conductivity type semiconductor layer formed on a substrate selected from the group consisting of a semi-insulative substrate, a high resistivity semiconductor substrate and an insulative substrate, said method characterized in that the anodic oxidation includes the steps of:

maintaining an electrolytic current for the anodic oxidation in an electrolyte at a predetermined constant value, illuminating the face of the semiconductor layer to be anodically oxidized with a light of a predetermined intensity and forming a depletion layer of a specified thickness therein, and continuing said anodic oxidation until the bottom face of said depletion layer reaches an interface between said n-conductivity type semiconductor layer and said substrate and a uniform anodic oxidation layer is produced.

2. A method of making a semiconductor device in accordance with claim 1, wherein prior to said anodic oxidation, anodically oxidizing under an illumination intensity greater than that of said predetermined intensity while avoiding forming said depletion layer, and thereafter changing the illumination intensity from said sufficiently greater value to a lower value, wherein the illumination intensity is set when the anodic oxidation voltage increases by a predetermined voltage difference.

3. A method of making a semiconductor device in accordance with claim 1 or 2, including forming an insulation film on said n-conductivity type semiconductor layer prior to said anodic oxidation, said insulation film having an opening, through which said anodic oxidation of said n-conductivity type semiconductor layer is made, and subsequent to said anodic oxidation, removing the resultant anodically oxidized layer thereby to form a recess, forming a gate electrode in said recess, and forming a source electrode and a drain electrode on said n-conductivity type semiconductor layer on both sides of said recess.

4. A method of making a semiconductor device in accordance with claim 1 or 2, including forming an insulation film on said n-conductivity type semiconductor layer prior to said anodic oxidation, said insulation film having an opening, through which said anodic oxidation of said n-conductivity type semiconductor layer is made, and after said anodic oxidation, forming electrodes on said n-conductivity type semiconductor layer on both sides of said recess, thereby forming a resistor between said electrodes.

5. A method of making a semiconductor device in accordance with claim 4, said insulation film is a photoresist film.

6. A method of making a semiconductor device in accordance with claim 1 or 2, wherein said substrate is a semi-insulative GaAs substrate, and said n-conductivity type GaAs layer.

7. A method of making a semiconductor device in accordance with claim 1 or 2, wherein said light is a white light.

8. A method of making a semiconductor device in accordance with claim 1 or 2, wherein the illumination intensity of said light on the n-conductivity type semiconductor layer surface for said anodic oxidation is between 100 lx to 10,000 lx.

9. A method of making a semiconductor device in accordance with claim 1 or 2, wherein the temperature of the electrolyte of anodic oxidation is between 0° C. and 60° C.

10. A method of making a semiconductor device in accordance with claim 3 said insulation film is a photoresist film 11. A method of making a semiconductor device having a uniform layer thickness comprising anodically oxidizing in an electrolyte under light illumination an impurity-containing n-type semiconductor layer that is formed on a substrate, the substrate selected from the group consisting of a semi-insulative substrate, a high resistivity semiconductor substrate and an insulative substrate, said method characterized in that the anodic oxidation includes steps of:

A. maintaining an electrolyte current for the anodic oxidation at a predetermined constant value while conducting said oxidation, B. illuminating the surface of said n-type semiconductor layer with a predetermined constant light intensity and forming a depletion layer under the anodically oxidized layer at the surface of said n-type semiconductor layer, the thickness of said depletion layer being determined by (1) said predetermined constant value of said electrolytic current, (2) said predetermined constant light intensity and (3) the impurity concentration in said n-type semiconductor layer, C. continuing said anodic oxidation until all parts of the bottom face of said depletion layer apart from said anodically oxidized layer and inside said n-type semiconductor layer reach an interface between said n-type semiconductor layer and said substrate resulting in a layer of a uniform thickness equal to that of said depletion layer under said anodically oxidized layer, said predetermined constant light intensity providing the uniform thickness for said layer under said anodically oxidized layer.

12. A method of making a semiconductor device having a uniform layer thickness in accordance with claim 11 further comprising prior to said anodic oxidation, the preceding step of anodically oxidizing with an illumination intensity sufficiently greater than that of said predetermined intensity while avoiding forming said depletion layer, and thereafter reducing the illumination intensity from said sufficiently greater value to a lower value, wherein the illumination intensity is set when the anodic oxidation voltage increases by a predetermined voltage difference.

13. A method of making a semiconductor device having a uniform layer thickness in accordance with claim 11 or 12, further comprising, prior to said anodic oxidation, the preceding step of forming an insulation film on said n-type semiconductor layer, said insulation film having an opening through which said anodic oxidation of said n-type semiconductor layer is made, removing the resultant anodically oxidized layer after said anodic oxidation thereby forming a recess, forming a gate electrode in said recess, and forming a source electrode and a drain electrode on said n-type semiconductor layer on both sides of said recess.

14. A method of making a semiconductor device having a uniform layer thickness in accordance with claim 11 or 12, further comprising, prior to said anodic oxidation, the preceding step of forming an insulation film on said n-type semiconductor layer, said insulation film having an opening through which said anodic oxidation of said n-type semiconductor layer is made, and after said anodic oxidation is complete, forming electrodes on said n-type semiconductor layer on both sides of said recess, thereby forming a resistor between said electrodes.

15. A method of making a semiconductor device having a uniform layer thickness in accordance with claim 11 or 12, wherein said substrate is a semi-insulative GaAs substrate; and said n-type semiconductor layer is an n-type GaAs layer.

16. A method of making a semiconductor device having a uniform layer thickness in accordance with claim 11 or 12, wherein said light is a white light.

17. A method of making a semiconductor device having a uniform layer thickness in accordance with claim 11 or 12, wherein said illumination intensity for said anodic oxidation on said n-type semiconductor layer is between 100 lx to 100,000 lx.

18. A method of making a semiconductor device having a uniform layer thickness in accordance with claim 11 or 12, wherein the temperature of said electrolyte in said anodic oxidation is between 0° C. and 60° C.

19. A method of making a semiconductor device having a uniform layer thickness in accordance with claim 13, wherein said insulation film is a photoresist film.

20. A method of making a semiconductor device having a uniform layer thickness in accordance with claim 14, said insulation film is a photoresist film.

21. A method of making a compound semiconductor device having a uniform layer thickness comprising anodically oxidizing in an electrolyte under light illumination an impurity-containing n-type compound semiconductor layer formed on a substrate selected from the group consisting of a semi-insulative substrate, a high resistivity compound semiconductor substrate and an insulative substrate, said method characterized in that the anodic oxidation includes the steps of:
   A. maintaining an electrolytic current for the anodic oxidation at a predetermined constant value while conducting said oxidation,
   B. illuminating the surface of said n-type compound semiconductor layer with a light of a predetermined constant intensity and forming a depletion layer under the anodically oxidized layer at the surface of said n-type compound semiconductor layer, the thickness of said depletion layer being determined by said predetermined constant value of said electrolytic current, said predetermined constant light intensity and the impurity concentration in said n-type compound semiconductor layer,
   C. continuing said anodic oxidation until all parts of the bottom face of said depletion layer apart from said anodically oxidized layer and inside said n-type compound semiconductor layer reach an interface between said n-type compound semiconductor layer and said substrate resulting in a layer of a uniform thickness equal to that of said depletion layer under said anodically oxidized layer, said predetermined constant light intensity providing the uniform thickness for said layer under said anodically oxidized layer.

22. A method of making a compound semiconductor device having a uniform layer thickness in accordance with claim 21, further comprising prior to said anodic oxidation, the preceding step of anodically oxidizing with an illumination intensity sufficiently greater than that of said predetermined intensity while avoiding forming said depletion layer, and thereafter
   reducing the illumination intensity from said sufficiently greater value to a lower value, wherein the illumination intensity is set when the anodic oxidation voltage increases by a predetermined voltage difference.

23. A method of making a semiconductor device having a uniform layer thickness in accordance with claim 21 or 22, further comprising, prior to said anodic oxidation, the preceding step of forming an insulation film on said n-type compound semiconductor layer, said insulation film having an opening through which said anodic oxidation of said n-type compound semiconductor layer is made,
   removing the resultant anodically oxidized layer after said anodic oxidation thereby forming a recess,
   forming a gate electrode in said recess, and
   forming a source electrode and a drain electrode on said n-type compound semiconductor layer on both sides of said recess.

24. A method of making a compound semiconductor device having a uniform layer thickness in accordance with claim 21 or 22, further comprising, prior to said anodic oxidation, the preceding step of forming an insulation film on said n-type compound semiconductor layer, said insulation film having an opening, through which said anodic oxidation of said n-type compound semiconductor layer is made, and
   after said anodic oxidation is complete, forming electrodes on said n-type compound semiconductor layer on both sides of said recess, thereby forming a resistor between said electrodes.

25. A method of making a compound semiconductor device having a uniform layer thickness in accordance with claim 21 or 22, wherein said substrate is a semi-insulative GaAs substrate, and said n-type compound semiconductor layer is an n-type GaAs layer.

26. A method of making a compound semiconductor device having a uniform layer thickness in accordance with claim 21 or 22, wherein said light is a white light.

27. A method of making a compound semiconductor device having a uniform layer thickness in accordance with claim 21 or 22, wherein said illumination intensity for said anodic oxidation on said n-type compound semiconductor layer is between 100 lx to 10,000 lx.

28. A method of making a compound semiconductor device having a uniform layer thickness in accordance with claim 21 or 22, wherein the temperature of said electrolyte of said anodic oxidation is between 0° C. and 60° C.

29. A method of making a compound semiconductor device having a uniform thickness in accordance with claim 23, wherein said insulation film is a photoresist film.

30. A method of making a compound semiconductor device having a uniform layer thickness in accordance with claim 24, said insulation film is a photoresist film.

31. A method of making a compound semiconductor device having a uniform layer thickness comprising anodically oxidizing in an electrolyte under light illumination of an impurity-containing n-type GaAs layer formed on a substrate selected from the group consisting of a semi-insulative substrate, a high resistivity compound semiconductor substrate and an insulative substrate, said method characterized in that the anodic oxidation includes the steps of:
   A. maintaining an electrolyte current for the anodic oxidation at a predetermined constant value while conducting said oxidation,
   B. illuminating the surface of said n-type GaAs layer with a light of a predetermined constant intensity and forming a depletion layer under the anodically oxidized layer at the surface of said n-type GaAs layer, the thickness of said depletion layer being determined by said predetermined constant value of said electrolytic current, said predetermined constant light intensity and the impurity concentration in said n-type GaAs layer, C. continuing said anodic oxidation until all parts of the bottom face of said depletion layer apart from said anodically oxidized layer and inside said n-type GaAs layer reach an interface between said n-type GaAs layer and said substrate resulting in a layer of uniform thickness equal to that of said depletion layer under said anodically oxidized layer, said predetermined constant light intensity providing the uniform thickness for said layer under said anodically oxidized layer.

32. A method of making a compound semiconductor device having a uniform layer thickness in accordance with claim 31, further comprising, prior to said anodic oxidation, the preceding step of anodically oxidizing with an illumination intensity sufficiently greater than that of said predetermined intensity while avoiding forming said depletion layer, and thereafter a step of shifting illuminating intensity from said sufficiently greater value to a lower value, wherein the illumination intensity is set when the anodic oxidation voltage increases by a predetermined voltage difference.

33. A method of making a semiconductor device having a uniform layer thickness in accordance with claim 31 or 32, further comprising, prior to said anodic oxidation, the preceding step of forming an insulation film on said n-type GaAs layer, said insulation film having an opening, through which said anodic oxidation of said n-type GaAs layer is made, removing the resultant anodically oxidized layer after said anodic oxidation thereby forming a recess, forming a gate electrode in said recess, and forming a source electrode and a drain electrode on said n-type GaAs layer on both sides of said recess.

34. A method of making a compound semiconductor device having a uniform layer thickness in accordance with claim 31 or 32, further comprising, prior to said anodic oxidation, the preceding step of forming an insulation film on said n-type GaAs layer, said insulation film having an opening, through which said anodic oxidation of said n-type GaAs layer is made, and after said anodic oxidation is complete, forming electrodes on said n-type GaAs layer on both sides of said recess, thereby forming a resistor between said electrodes.

35. A method of making a compound semiconductor device having a uniform layer thickness in accordance with claim 31 or 32, wherein said substrate is a semi-insulative GaAs substrate, and an impurity concentration of said semi-insulative GaAs substrate is $10^8$ to $10^{13}$ atoms.cm$^{-3}$.

36. A method of making a compound semiconductor device having a uniform layer thickness in accordance with claim 31 or 32, wherein said light is a white light.

37. A method of making a compound semiconductor device having a uniform layer thickness in accordance with claim 31 or 32, wherein said illumination intensity for said anodic oxidation on said n-type GaAs layer is between 100 lx to 10,000 lx.

38. A method of making a compound semiconductor device having a uniform layer thickness in accordance with claim 31 or 32, wherein the temperature of said electrolyte of said anodic oxidation is between 0° C. and 60° C.

39. A method of making a compound semiconductor device having a uniform layer thickness in accordance with claim 33, wherein said insulation film is a photoresist film.

40. A method of making a compound semiconductor device having a uniform layer thickness in accordance with claim 38, wherein said insulation film is a photoresist film.

* * * * *